United States Patent
Hara et al.

(10) Patent No.: US 9,896,761 B2
(45) Date of Patent: Feb. 20, 2018

(54) TRAP ASSEMBLY IN FILM FORMING APPARATUS

(71) Applicant: TOKYO ELECTRON LIMITED, Tokyo (JP)

(72) Inventors: Masamichi Hara, Nirasaki (JP); Kaoru Yamamoto, Nirasaki (JP); Yasushi Mizusawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 530 days.

(21) Appl. No.: 14/491,940

(22) Filed: Sep. 19, 2014

(65) Prior Publication Data
US 2015/0136027 A1    May 21, 2015

Related U.S. Application Data

(63) Continuation of application No. PCT/JP2013/056833, filed on Mar. 12, 2013.

(30) Foreign Application Priority Data

Mar. 19, 2012  (JP) ................. 2012-062446

(51) Int. Cl.
*C23C 16/00* (2006.01)
*C23C 16/44* (2006.01)
(Continued)

(52) U.S. Cl.
CPC .......... *C23C 16/4412* (2013.01); *C23C 16/16* (2013.01); *C23C 16/455* (2013.01);
(Continued)

(58) Field of Classification Search
CPC ............... B01D 25/26; B01D 29/0052; B01D 29/0059; B01D 29/18;
(Continued)

(56) References Cited

U.S. PATENT DOCUMENTS

RE25,061 E * 10/1961 Raub ...................... B01D 45/08
                                                          55/436
3,136,627 A *  6/1964 Caldwell, Jr. ............. C22B 5/16
                                                          118/724
(Continued)

FOREIGN PATENT DOCUMENTS

JP    09042593       2/1997
JP    09042593 A  *  2/1997  ................ F16T 1/36
(Continued)

OTHER PUBLICATIONS

International Search Report completed Apr. 12, 2013; International Patent Application No. PCT/JP2013/056833.
(Continued)

*Primary Examiner* — Jeffrie R Lund
*Assistant Examiner* — Stanislav Antolin

(57) ABSTRACT

A trap mechanism for trapping exhaust gas from a process chamber. The trap assembly includes a housing containing a plurality of trap units. The plurality of trap units are arranged successively along a flow direction of said exhaust gas. Each trap unit includes a set of trap panels parallel to each other and spaced apart from each other. The two opposite surfaces with a larger area of each trap panel are oriented substantially parallel to a flow direction of the exhaust gas flow. The two opposite surfaces with a smaller area of each trap panels are oriented orthogonal to the exhaust gas flow.

18 Claims, 7 Drawing Sheets

(51) Int. Cl.
| | |
|---|---|
| *C23C 16/455* | (2006.01) |
| *C23C 16/458* | (2006.01) |
| *C23C 16/46* | (2006.01) |
| *H01J 37/32* | (2006.01) |
| *C23C 16/16* | (2006.01) |
| *B01D 8/00* | (2006.01) |
| *F15D 1/00* | (2006.01) |

(52) U.S. Cl.
CPC ............ *C23C 16/458* (2013.01); *C23C 16/46* (2013.01); *C23C 16/463* (2013.01); *H01J 37/32834* (2013.01); *H01J 37/32844* (2013.01); *B01D 8/00* (2013.01); *B01D 2258/0216* (2013.01); *F15D 1/0005* (2013.01); *Y02C 20/30* (2013.01); *Y02P 70/605* (2015.11)

(58) Field of Classification Search
CPC .... B01D 29/39–29/395; B01D 29/41–29/416; B01D 29/50–29/58; B01D 33/23; B01D 45/08; B01D 46/10; B01D 46/406; B01D 46/4263; B01D 47/05; B01D 50/002; B01D 53/002; B01D 53/261; B01D 53/263; B01D 53/265; B01D 53/72; B01D 53/8659; B01D 53/8662; B01D 8/00; B01D 25/0052; B01D 25/0059; B01D 25/18; B01D 25/39–25/395; B01D 25/41–25/416; B01D 25/50–25/58; B07B 1/46–1/469; C23C 16/16; C23C 16/4412; C23C 16/44; C23C 16/455; C23C 16/458; C23C 16/46; C23C 16/463; C30B 25/14; F15D 1/0005; G01N 2001/2223; H01J 37/32834; H01J 37/32844; H01J 37/32871; H01L 21/67017; Y02C 20/30; Y10S 55/15; Y10S 55/30
See application file for complete search history.

(56) References Cited

U.S. PATENT DOCUMENTS

| | | | | |
|---|---|---|---|---|
| 3,460,580 | A * | 8/1969 | Carter ................... | F15D 1/0005 138/42 |
| 4,150,168 | A * | 4/1979 | Yatsurugi ............... | C01B 33/035 264/81 |
| 4,468,011 | A * | 8/1984 | Sikander ................. | C22B 43/00 266/149 |
| 4,488,887 | A * | 12/1984 | Angel ...................... | B01D 8/00 55/308 |
| 5,405,445 | A * | 4/1995 | Kumada ............. | C23C 16/4412 118/715 |
| 5,704,214 | A * | 1/1998 | Fujikawa ................. | B01D 8/00 417/901 |
| 5,820,641 | A * | 10/1998 | Gu ....................... | B01D 5/0006 55/434.4 |
| 5,904,757 | A | 5/1999 | Hayashi et al. | |
| 5,928,426 | A * | 7/1999 | Aitchison ............ | B01D 53/005 118/715 |
| 6,156,107 | A * | 12/2000 | Hayashi ................ | B01D 45/08 438/905 |
| 6,221,155 | B1 * | 4/2001 | Keck ...................... | C23C 16/24 117/200 |
| 6,223,684 | B1 * | 5/2001 | Fujioka ............... | C23C 16/4401 118/715 |
| 6,332,925 | B1 * | 12/2001 | Noji ..................... | B01D 53/002 118/715 |
| 8,172,946 | B2 * | 5/2012 | Taniyama ........... | C23C 16/4412 118/715 |
| 2002/0014197 | A1 * | 2/2002 | Keck ...................... | C23C 16/24 117/87 |
| 2004/0035359 | A1 * | 2/2004 | Kannan .................. | C23C 16/34 118/715 |
| 2004/0081607 | A1 | 4/2004 | Hasegawa | |
| 2006/0162862 | A1 * | 7/2006 | Park ..................... | B01D 5/0015 156/345.29 |
| 2006/0169411 | A1 * | 8/2006 | Han .................... | C23C 16/4412 156/345.29 |
| 2008/0072585 | A1 | 5/2008 | Ikeda et al. | |
| 2008/0104935 | A1 * | 5/2008 | Tojo ....................... | B01D 45/06 55/282 |
| 2008/0166881 | A1 * | 7/2008 | Taniyama ........... | C23C 16/4412 438/758 |
| 2009/0217634 | A1 * | 9/2009 | Choi ..................... | B01D 45/08 55/426 |

FOREIGN PATENT DOCUMENTS

| | | | | |
|---|---|---|---|---|
| JP | 09072291 | | 3/1997 | |
| JP | 09072291 | A * | 3/1997 | ............. C23C 16/44 |
| JP | 09072493 | | 3/1997 | |
| JP | 09072493 | A * | 3/1997 | ............. F04C 25/02 |
| JP | 10140357 | | 5/1998 | |
| JP | 11302851 | | 2/1999 | |
| JP | 2001214272 | | 8/2001 | |
| JP | 2003247075 | | 9/2003 | |
| JP | 2007318100 | | 12/2007 | |

OTHER PUBLICATIONS

Toshio, et al.; Exhaust System Structure of Film Forming Device and Method of Removing Impurity Gas; Abstract for JP2001-214272; Aug. 7, 2001; http://www.19.ipdl.inpit.gp.jp.

Saito Masayuki; LPCVD Apparatus, and Thin Film Deposition Method; Abstract for JP2003-247075; Sep. 5, 2003; http://www.19.ipdl.inpit.gp.jp.

Takeshi, et al.; Exhaust System; Abstract for JP2007-318100; Dec. 6, 2007; http://www.19.ipdl.inpit.gp.jp.

Mitsuru, et al.; Trap; Abstract for JP09-042593; Feb. 14, 1997; http://www.19.ipdl.inpit.gp.jp.

Tatsuya, et al.; Trap for Front Step of Dry Vacuum Pump; Abstract for JP09-072291; Mar. 18, 1997; http://www.19.ipdl.inpit.gp.jp.

Tatsuya, et al.; Trap for Dry Vacuum Pump Rear Stage; Abstract for JP09-072493; Mar. 18, 1997; http://www.19.ipdl.inpit.gp.jp.

Kazuichi, et al.; Trapping Device; Abstract for JP10-140357; May 26, 1998; http://www.19.ipdl.inpit.gp.jp.

Yuji, et al.; Gaseous Starting Material Collecting Trap for CVD System; Abstract for JP11-302851; Nov. 2, 1999; http://www.19.ipdl.inpit.gp.jp.

\* cited by examiner

TRAP ASSEMBLY IN FILM FORMING APPARATUS

CROSSREFERENCE

This application is a Continuation application of PCT International Application No. PCT/JP2013/056833 filed on Mar. 12, 2013, which designates the United States, and claims priority and benefit to Japanese Patent Application No. 2012-062446 filed on Mar. 19, 2012. The foregoing patent applications are herein incorporated by reference in entirety.

FIELD OF THE INVENTION

The present invention relates to film forming apparatuses, and more specifically to exhaust gas treatment mechanisms of film forming apparatuses.

BACKGROUND OF THE INVENTION

In general, the manufacture of a semiconductor device repeatedly involves film forming (e.g., film deposition) and etching processes performed on a surface of a substrate, e.g., a semiconductor wafer, a glass substrate, an LCD substrate, etc. For example, a film can be formed on a surface of a substrate by chemical reactions (including decomposition) of a processing gas (source gas) in a processing chamber. At the same time, the chemical reactions also generate by-products usually volatile and in gas form. The gas-form reaction by-products can be removed from the processing chamber as exhaust gas which also includes the unreacted processing gas.

The reaction by-products or the unreacted processing gas needs to be contained or treated before being discharged to the environment to prevent pollution. In addition, the discharge of the unreacted processing gas is an economic waste. Thus, a trap device (or assembly) coupled to the gas exhaust system of a film forming apparatus is used to confine and capture the reaction by-products and/or the unreacted processing gas.

Various configurations of the trap mechanism have been developed depending on the characteristics of the gas species to be trapped. For example, in the case of removing gas species that can condense at room temperature, a trap device having a plurality of trap panels in a housing is used to confine the exhaust gas. When the exhaust gas flow encounters the trap panels, the unreacted processing gas, the reaction by-products and the like can adhere to the panel surfaces and thereby be intercepted.

A trap panel typically has two opposite principle surfaces and two opposite auxiliary surfaces, where the principle surfaces have a larger area than the auxiliary surfaces. Conventionally, the principal trap surfaces of the trap panels are placed orthogonal to the flow direction of the exhaust gas to facilitate contact between exhaust gas and panel surfaces. However, in reality, the exhaust gas flow is disturbed when encountering the principal trap surfaces, causing turbulent flows. The gas molecules or other particles in a turbulent flow tend to escape from being trapped by the trap panels, which counteracts the capture effect.

SUMMARY OF THE INVENTION

Embodiments of the present invention provide a trap mechanism with improved capture rate of condensable species discharged from a film forming apparatus.

In accordance with an embodiment of the present invention, a trap assembly includes a housing and a plurality of trap units. The housing is configured to form a gas exhaust conduit for an exhaust gas flow discharged from a processing chamber. The plurality of trap units are contained by said housing and arranged successively along a flow direction of said exhaust gas. Each trap unit comprises a set of trap panels parallel to each other and spaced apart from each other. Each trap panel comprises a first surface and a second surface that has a smaller surface area than said first surface. The first surfaces of said set of trap panels are oriented substantially parallel to a flow direction of said exhaust gas flow. The second surfaces of said set of trap panels are oriented orthogonal to said flow direction of said exhaust gas flow.

This summary contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below

BRIEF DESCRIPTION OF THE DRAWINGS

Embodiments of the present invention will be better understood from a reading of the following detailed description, taken in conjunction with the accompanying drawing figures in which like reference characters designate like elements and in which.

DETAILED DESCRIPTION

Figure 1:
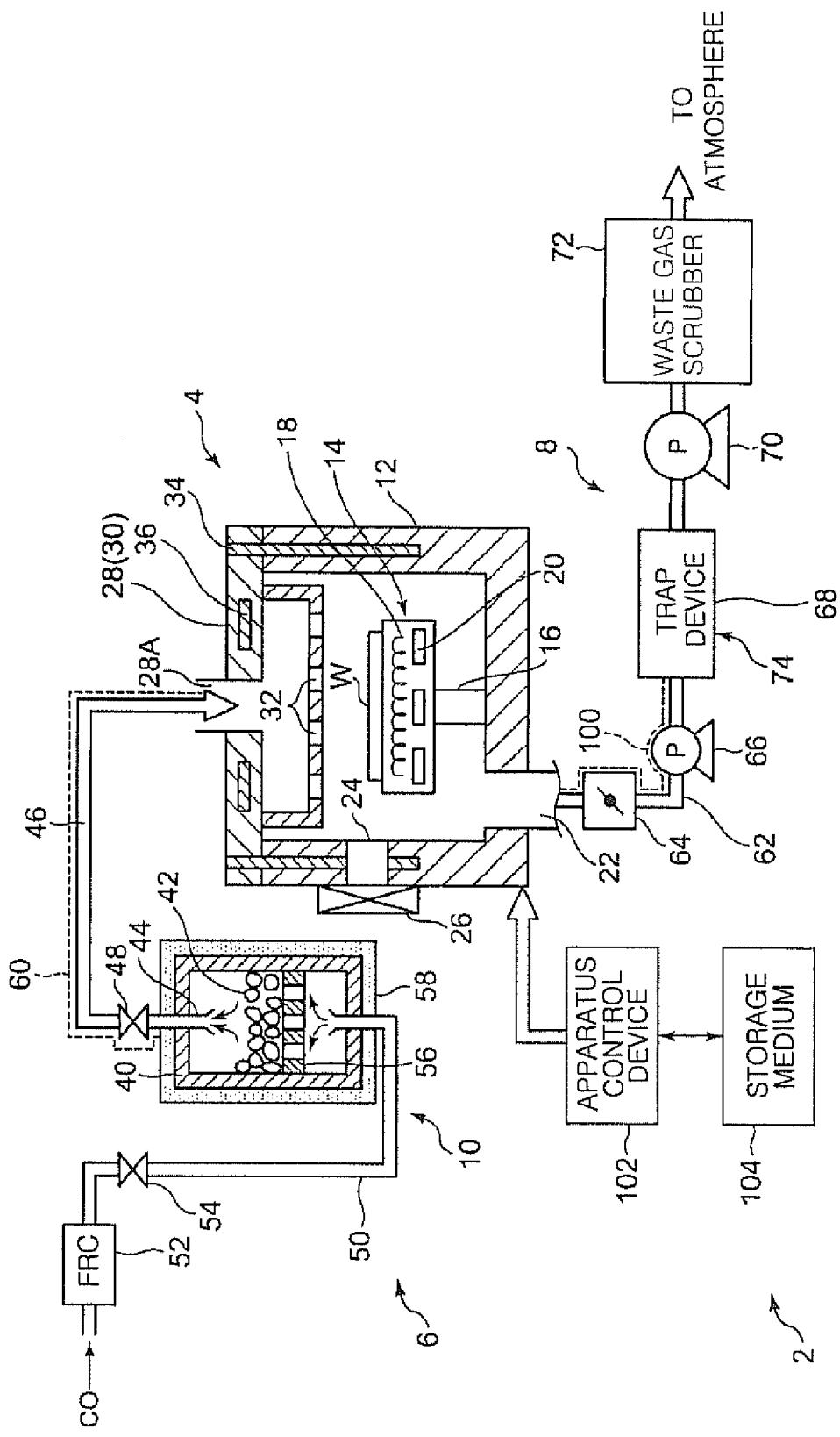
FIG. 1 shows the configuration of an exemplary film forming apparatus including a trap assembly in accordance with an embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, generally refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or client devices. When a component appears in several embodiments, the use of the same reference numeral signifies that the component is the same component as illustrated in the original embodiment.

Trap Assembly in Film Forming Apparatus

Figure 2:
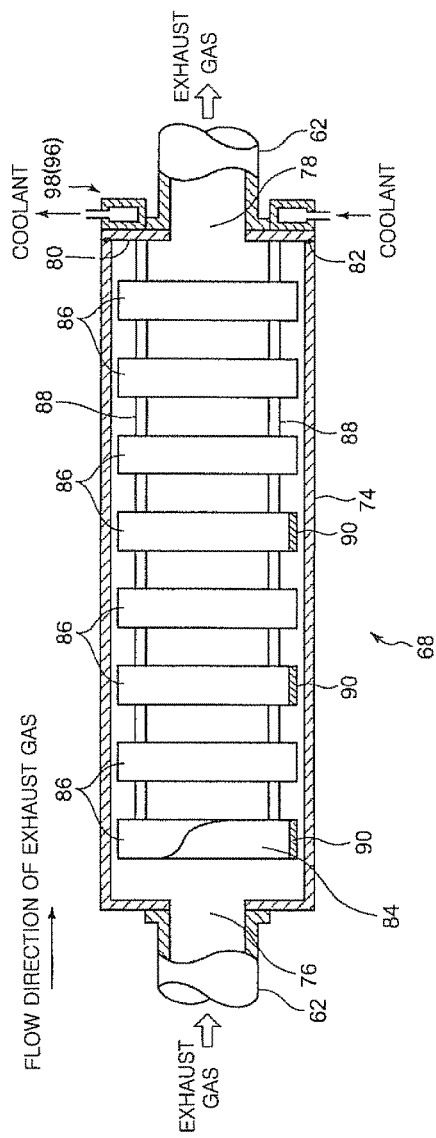
FIG. 2 shows a vertical cross-sectional view of an exemplary trap assembly in accordance with an embodiment of the present invention.
Figure 3:
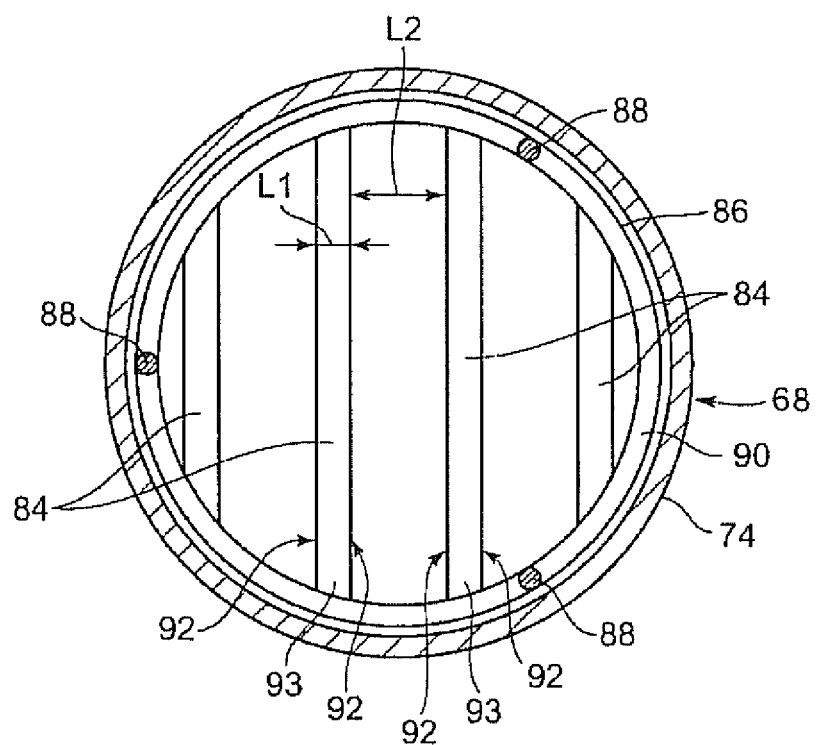
FIG. 3 is shows a horizontal cross-sectional view of an exemplary trap unit in accordance with the embodiment of the present invention.
Figure 4:
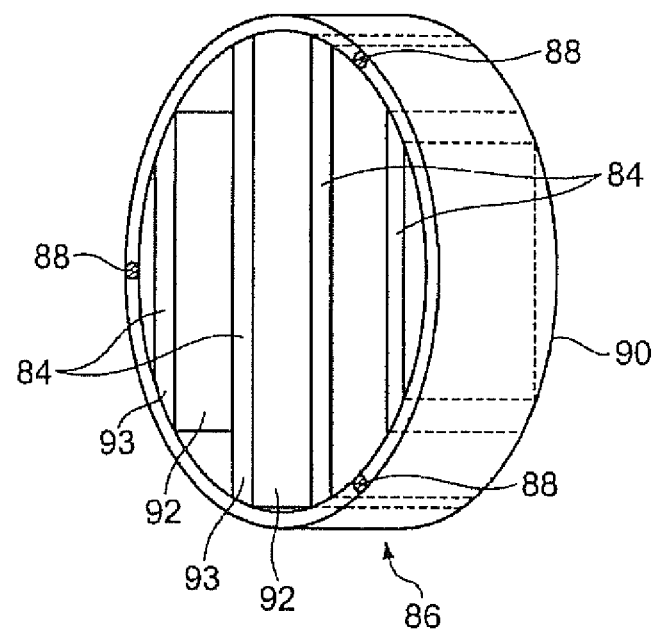
FIG. 4 shows a perspective view of an exemplary trap unit in accordance with the embodiment of the present invention.
Figure 5:
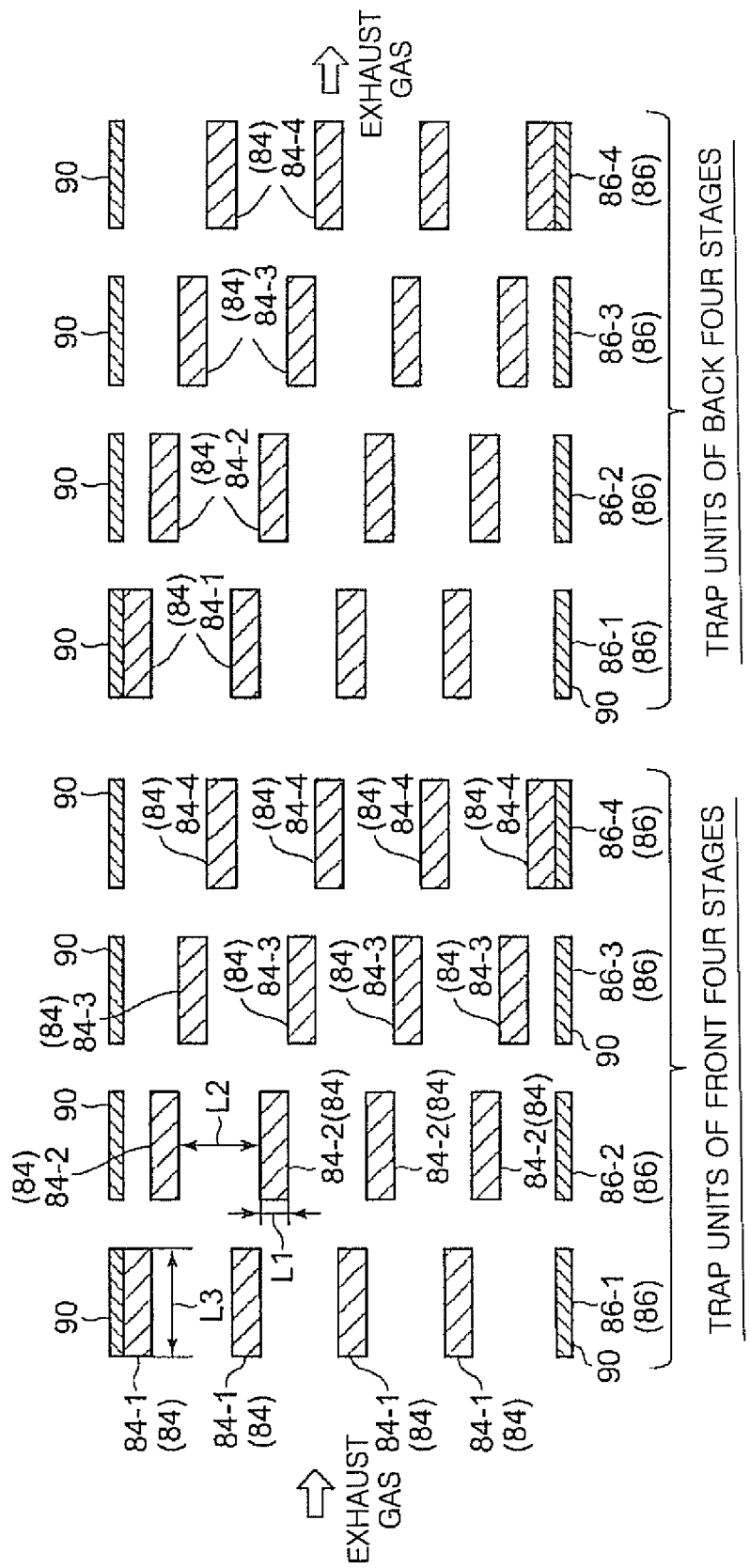
FIG. 5 shows a top cross-sectional view of an arrangement of the trap panels in an exemplary trap assembly in accordance with an embodiment of the present invention.
Figure 6:
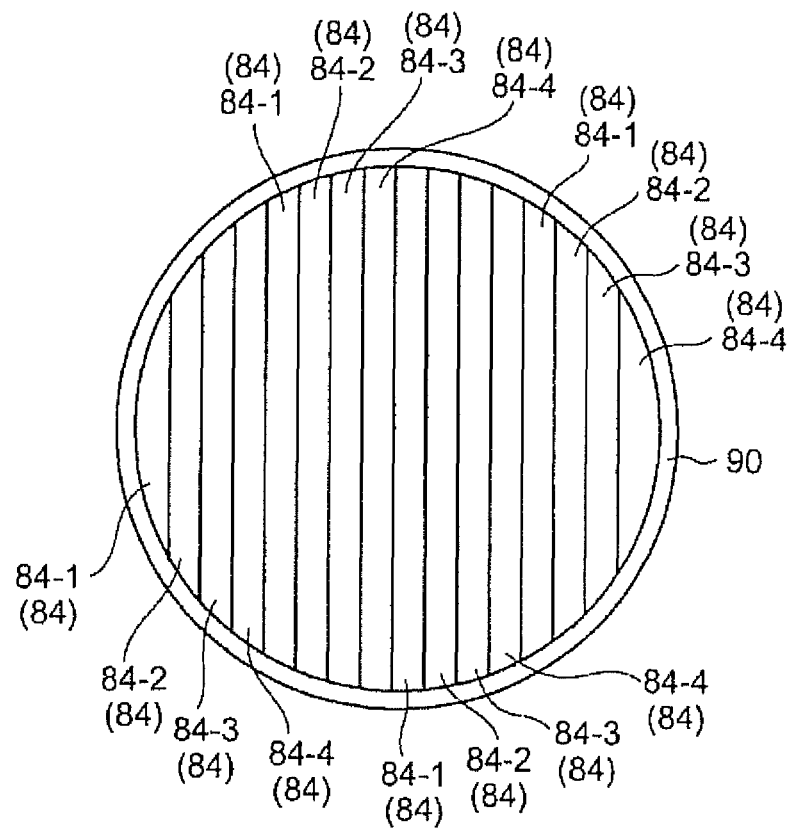
FIG. 6 shows a collapsed view of an exemplary trap assembly viewed in the exhaust gas flow direction in accordance with the embodiment of the present invention.

FIG. 1 shows the configuration of an exemplary film forming apparatus including a trap assembly in accordance with an embodiment of the present invention. FIG. 2 shows a vertical cross-sectional view of an exemplary trap assembly in accordance with an embodiment of the present invention. FIG. 3 is shows a horizontal cross-sectional view of an exemplary trap unit in accordance with an embodiment of the present invention. FIG. 4 shows a perspective view of the exemplary trap unit (as shown in FIG. 3) in accordance with an embodiment of the present invention. FIG. 5 shows a top cross-sectional view of the arrangement of trap panels in an exemplary trap assembly in accordance with an embodiment of the present invention. FIG. 6 shows a collapsed view of an exemplary trap assembly viewed in the exhaust gas flow direction in accordance with the embodiment of the present invention.

Embodiments of the present invention are described herein with reference to a thin forming process and apparatus including an exemplary trap assembly. For instance, a Ru metal film is formed in the apparatus using an organic metal compound (e.g., $Ru_3(CO)_{12}$) as a carbonyl-based organic metal compound and a carrier gas (e.g., CO).

As shown in FIG. 1, a film forming apparatus 2 in accordance with an embodiment of the present invention includes: an apparatus main body 4 for performing film formation on a substrate, e.g., a circular plate-shaped semiconductor wafer W (hereinafter, referred to as "wafer W"); a gas supply system 6 for supplying requisite gas (e.g., precursor gas, carrier gas, and purge gas) to the apparatus main body 4; and a gas exhaust system 8 for discharging exhaust gas from the apparatus main body 4. The gas supply system 6 has a source gas supply system 10 for supplying a source gas (or precursor gas) for film formation. If necessary, the gas supply system 6 further includes a purge gas supply system for supplying a purge gas, e.g., $N_2$ gas or the like.

The apparatus main body 4 has a cylindrical processing chamber 12 made of aluminum alloy or the like. The mounting table 14 is configured to support wafer W in position during processing. The mounting table 14 is fixed on a top surface of a metallic supporting post 16 which is made of, e.g., aluminum alloy or the like and stands upright from a bottom wall of the processing chamber 12.

A heater 18 (e.g., a tungsten wire heater, a carbon wire heater or the like) is installed in an upper portion of the mounting table 14 to heat the wafer W. A coolant channel 20 for cooling a lower portion and a side portion of the mounting table 14 sits below the heater 18 in the mounting table 14. Lifter pins (not shown) to facilitate wafer transfer to and from the mounting table are installed in the mounting table 14.

A gas exhaust port 22 is located at the bottom wall of the processing chamber 12. A gas exhaust system 8 is coupled to the gas exhaust port 22 to pump the processing chamber 12 to a vacuum. An opening 24 for loading and unloading wafers is loaded and unloaded is located at a sidewall of the processing chamber 12. A gate valve 26 for airtightly opening/closing the opening 24 is installed at the opening 24.

A source gas introduction unit 30 (e.g., a shower head 28) is installed at a top portion of the processing chamber 12 to supply a source gas into the processing chamber 12 through gas injection openings 32. Heaters 34 and 36 are used to heat the sidewall of the processing chamber 12 and the shower head 28 to prevent source gas condensation. The source gas supply system 10 and optionally another gas supply system are coupled to a gas inlet. 28A of the shower head 28.

In one embodiment, the source gas and another gas may be mixed in the shower head 28 and introduced to the chamber 12. Alternatively, they are separately introduced and mixed in the processing chamber 12. In the illustrated example, the shower head 28 is used as the gas introduction unit 30. However, a nozzle or the like may also be used. A gas introduction mechanism is not particularly limited thereto.

The source gas supply system 10 includes a source tank 40 for storing a solid source or a liquid source. Here, the source tank 40 stores a solid source 42, e.g., organic metal compound source. For instance, $Ru_3(CO)_{12}$ is used as the solid source 42. Since the solid source 42 generally has a considerably low vapor pressure, the solid source 42 has a low rate of evaporation. In another embodiment, a liquid source from which a source gas is generated by bubbling or the like is used instead of the solid source 42.

A source path 46 for delivering the source gas from the source tank 40 to the chamber has one end coupled to a gas outlet 44 at a top portion of the source tank 40 and the other end coupled to the gas inlet 28A of the shower head 28. An on-off valve 48 is attached to the source path 46 near the source tank 40.

A carrier gas line 50 for supplying a carrier gas to the source tank 40 is coupled to the bottom of the source tank 40. A flow rate controller (FRC) 52 such as a mass flow controller and a carrier gas on-off valve 54 are installed at the carrier gas line 50 in that order. The source gas is generated by heating and vaporizing the solid source 42 and transported with the carrier gas at a controlled flow rate.

In the source tank 40, a porous plate 56 is installed in the proximity of the carrier gas line 50. Accordingly, the solid source 42 is placed on the porous plate 56, and the carrier gas supplied from the carrier gas line 50 is uniformly supplied into the source tank 40 through holes formed in the porous plate 56. In this example, CO is used as the carrier gas.

A tank heating unit 58 is installed at the source tank 40 and covers the entire tank to facilitate vaporization of the solid source 42. In this case, the solid source 42 is heated to a temperature lower than the reaction, including decomposition, temperature of the solid source 42 but higher than or equal to the condensation temperature thereof. In the source path 46, a path heater 60 such as a tape heater is used to heat the source path 46 to a temperature lower than the reaction temperature and higher than or equal to the condensation temperature.

The gas exhaust system 8 has a gas exhaust path 62 coupled to the gas exhaust port 22 of the processing chamber 12. Specifically, a pressure control valve 64, a first vacuum pump 66, a trap assembly 68 in accordance with the embodiment of the present invention, a second vacuum pump 70 and a waste gas scrubber 72 are installed at the gas exhaust path 62 in that order from an upstream side to a downstream side thereof.

The pressure control valve 64 is a butterfly valve to control a pressure in the processing chamber 12. The first vacuum pump 66 is a turbo molecular pump installed on the upstream side, and the second vacuum pump 70 is a dry pump. Depending on the desired processing conditions set for film formation, either one of the two pumps 66 and 70 may be used.

When the exhaust gas flows through the trap assembly 68, the unreacted source gas can be trapped. Specifically, as shown in FIGS. 2 to 6, the trap assembly 68 includes a housing 74 made of a metal, e.g., stainless steel, aluminum alloy or the like. In case that the processing gas is corrosive, the housing 74 can be made of or coated with a corrosion resistant material. The housing 74 has a cylindrical shape. A gas inlet 76 is formed at one end of the housing 74, and a gas outlet 78 is formed at the other end of the housing 74. The gas inlet 76 and the gas outlet 78 are coupled to the upstream and the downstream sides of the gas exhaust path 62, respectively.

An end plate of the housing 74 where the gas outlet 78 is formed serves as an opening/closing lid 80. The opening/closing lid 80 is airtightly and detachably installed through a seal member 82 such as an O-ring or the like.

A plurality of trap units 86 are installed inside the housing 74 and provide large contact surface areas to intercept the condensable exhaust gas. The plurality of trap units 86 are spaced apart along the flow direction of the exhaust gas in a certain interval or intervals. Each of the trap units 86 includes multiple trap panels 84. In this example, eight trap units 86 (see FIG. 2) are included in the trap assembly 68 and arranged at eight positions (or stages) along housing (or the gas exhaust flow direction). The trap units 86 are connected and supported as one unit by a plurality of supporting rods 88. The supporting rods extend along the inner surface of the housing 74 and have one ends coupled to the opening/closing lid 80. The trap units 86 can be inserted into and removed from the housing 74 at the opening/closing lid 80 side of the housing 74 during maintenance. Here, three supporting rods 88 are illustrated (see FIG. 3). In each of the trap units 86, a plurality of trap panels 84 are installed, e.g., four in this example. However, the present disclosure is not limited by the number of the trap panels in a trap unit.

Each trap panel has two opposite principal trap surfaces 92 (trap surfaces having a relatively large width) and two opposite auxiliary trap surfaces (trap surfaces having a relatively small width) 93. The trap panels 84 are oriented such that principal trap surfaces 92 are parallel to the flow direction of the exhaust gas, or the lengthwise direction of the housing 74. The trap panels 84 are spaced apart from one another at predetermined intervals in a direction orthogonal to the flow direction of the exhaust gas. In other words, the trap panels 84 are arranged such that auxiliary trap surfaces 93 of the trap panels 84 are orthogonal to the flow direction of the exhaust gas. Further, an annular supporting ring 90 forms an outer periphery of the trap unit 86 to support the trap panels 84 as one unit by connecting both ends of the trap panels 84 to the supporting ring 90.

Each of the trap panels 84 has a rectangular cross section. The entire exterior surfaces of the trap panels 84 serves as contact surfaces with exhaust gas flow. As shown in FIGS. 3 and 4, the lengths of the trap panels 84 vary due to their different installation positions with respect to the annular supporting ring 90. The surfaces of the supporting ring 90 also serve as trap surfaces.

The present disclosure is not limited to specific dimensions of various components in a trap assembly. In one embodiment, the housing 74 has a diameter of about 20 cm and a length of about 40 cm. Each of the trap panels 84 has a thickness L1 in a range from about 10 mm to 15 mm and a width L3 (see FIG. 5) in a range from about 10 mm to 20 mm. A distance between adjacent trap panels 84 (or an arrangement pitch L2) within a trap unit ranges from about 20 mm to 40 mm. L1 and L3 are configured such that thickness L1 is less than width L3. In some embodiments, L1 is larger than 10 mm and smaller than 15 mm. A distance between adjacent trap units 86 is, e.g., about 40 mm to 80 mm.

In some embodiments, the installation positions of the trap panels 84 with reference to the annular supporting ring 90 are misaligned in a direction orthogonal to the flow direction of the exhaust gas in the respective trap units 86. Specifically, as shown in FIG. 5, with respect to the trap units 86 arranged sequentially in the flow direction of the exhaust gas, the installation positions of the trap panels 84 in one trap unit 86 are shifted from the corresponding positions of the trap panels 84 in the adjacent trap unit (e.g., the previous stage) in a direction orthogonal to the flow direction. In this example, each panel shifts by the thickness of the trap panels 84 from the corresponding channel in the previous stage. Further, the sum of the projection planes of the trap panels 84 in all front four trap units 86 (in the front four stages) covers a substantial portion of the housing cross-section. In one embodiment, at least 95% of a cross-section of the housing 74 is covered except for a small gap formed between the inner peripheral surface of the housing 74 and the outer peripheral surface of the supporting ring 90 and a plate thickness of the supporting ring 90.

As shown in FIG. 6, the interior cross section of the supporting ring interior is covered by the aggregation of projection planes of the auxiliary trap surfaces 93 of the trap panels 84. If a trap unit disposed at a most upstream side is defined as the first stage, trap panels 84-1 in the trap unit 86-1 (the first stage), trap panels 84-2 in the trap unit 86-2 (the second stage), trap panels 84-3 in the trap unit 86-3 (the third stage), and trap panels 84-4 in the trap unit 86-4 (the fourth stage) are installed sequentially in that order, as shown in the projection view of FIG. 6.

When viewed from the flow direction of the exhaust gas flow, the cross-section in the annular supporting ring 90 is substantially or entirely blocked optically and the exhaust gas cannot pass through the housing 74 linearly. When viewed from the flow direction of the exhaust gas flow, the edge portions of the corresponding trap panels 84 in adjacent stage may either be slightly overlapped or separated. However, the trap panels of the trap units may be installed in any other suitable spacing pattern and configuration. The anteroposterior positions of the trap units 86-1 to 86-4 may also vary in different embodiments.

A set of trap units 86 of back four stages disposed on the downstream side of the exhaust gas flow has the same configuration as that of the set of trap units 86 of front four stages. Here, two sets each including four trap units 86 are installed at the front and the back. However, the number of sets enclosed in the housing is not limited to two. Rather, one set or three or more sets may be used in other embodiments.

A cooling unit 96 (see FIG. 2) for cooling the trap panels 84 is installed in the housing 74. Specifically, the cooling unit 96 has a cooling jacket 98 with coolant circulating inside, such as cooling water or the like. The cooling jacket 98 is installed at the opening/closing lid 80 serving as a partition wall of the housing 74. Accordingly, the opening/closing lid 80, the supporting rods 88, the supporting ring 90 and the trap panels 84 are cooled by the cooling jacket 98. Here, the trap panels 84 are cooled to, e.g., about 25° C. In this case, the trap panels 84 can be effectively cooled by forming a coolant path at the supporting rods 88, the supporting ring 90 or the like. It is preferable to use a high thermal conductive material, e.g., aluminum alloy or aluminum, for the respective components of the cooling unit. In some embodiments, a cooling unit may not be needed due to the characteristics of gas species to be trapped.

Referring back to FIG. 1, a path heater 100 such as a tape heater or the like is installed along the gas exhaust path 62 extending from the gas exhaust port 22 of the processing chamber 12 to the trap assembly 68. The exhaust gas flowing in the gas exhaust path 62 can be heated to prevent the unreacted source gas from condensation. In some embodiments, the unreacted gas may be reused later for film processing.

Here, CO (carbon monoxide) is delivered as carrier gas and also generated by decomposition of the source gas. The waste gas scrubber 72 installed on the downstream side of the second vacuum pump 70 detoxifies the harmful gas (CO) in the exhaust gas, e.g., through combustion.

The operations of the film forming apparatus 2 configured as described above can be controlled by an apparatus control unit 102 including a computer. The computer can be used to control gas supplies, a processing temperature, a processing pressure, a temperature of the coolant path, supply of the coolant into the trap assembly 68, and circulation of the coolant, etc.

A computer program configured for such control is stored in a storage medium 104. The storage medium 104 may be flexible disk, a CD (Compact Disc), a CD-ROM, a hard disk, a flash memory, a DVD, etc.

Figure 7:
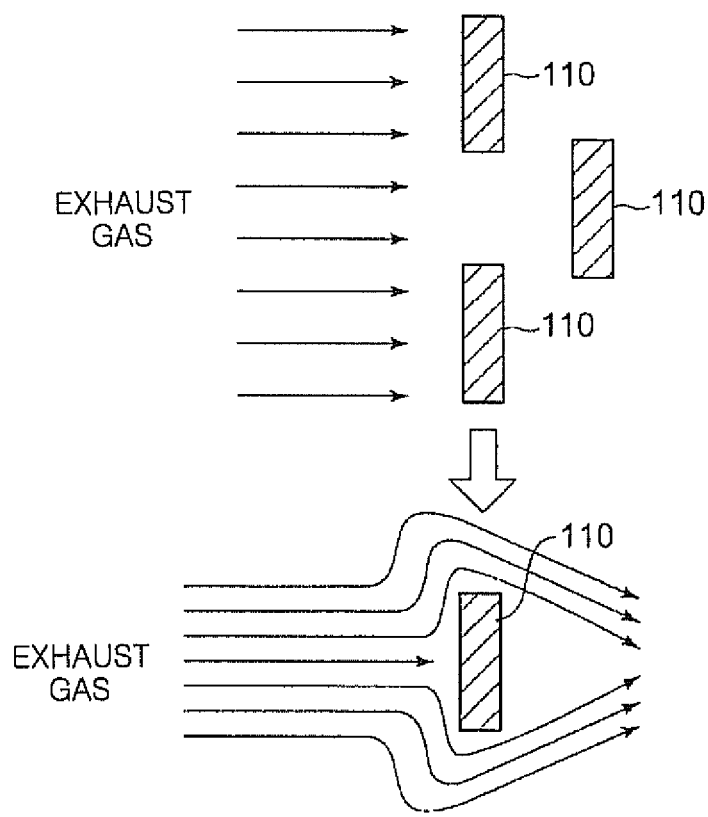
FIG. 7 illustrates the flow of the exhaust gas in a trap assembly in accordance with the prior art.
Figure 8:
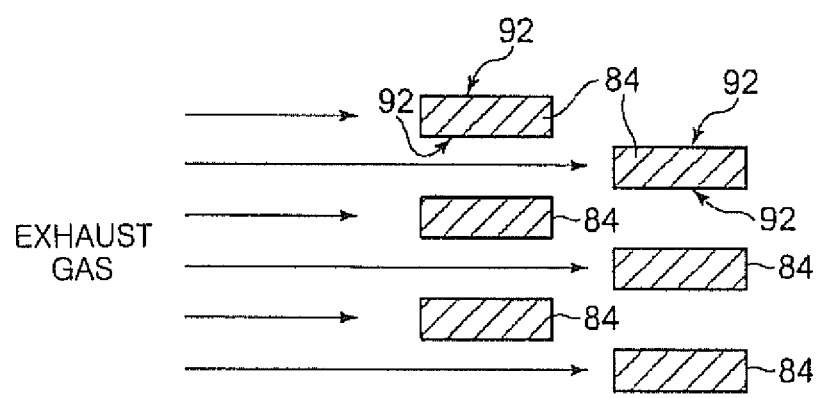
FIG. 8 illustrates the flow of the exhaust gas in an exemplary trap assembly in accordance with an embodiment of the present invention.

FIG. 7 illustrates the flow of the exhaust gas in a conventional trap assembly. FIG. 8 illustrates the flow of the exhaust gas in an exemplary trap assembly in accordance with an embodiment of the present invention.

Referring back to FIG. 1, in the apparatus main body 4 of the film forming apparatus 2, the processing chamber 12 is maintained at a vacuum pressure using the first and the second vacuum pump 66 and 70. The wafer W held by the mounting table 14 is maintained at a predetermined temperature by the heater 18. The sidewall of the processing chamber 12 and the shower head 28 are maintained at an elevated temperature by the heaters 34 and 36, respectively. Such a temperature is lower than the temperature for the source gas to decompose and higher than or equal to the temperature for the source gas to condense. For example, they are heated to about 80° C.

The source gas supply system 10 is heated in advance to a predetermined temperature, e.g., about 80° C. as described above, by the tank heating unit 58 and the path heater 60. In the source gas supply system 10, when the film forming process is started, the solid source 42 stored in the source tank 40 is heated and vaporized while using CO as the carrier gas. As a result, the source gas is generated.

The source gas thus flows through the source path 46 toward the downstream side with the carrier gas. Then, the source gas is introduced into the processing chamber 12 from the shower head 28. In the processing chamber 12, a Ru metal thin film is formed on the wafer W by CVD (Chemical Vapor Deposition). The processing conditions at this time are set as follows: a processing pressure is about 0.1 Torr (13.3 Pa); and a wafer temperature is in the range from 150° C. to 250° C. such that the source gas can decompose into the expected film composition.

In reality, a significant portion of the source gas, e.g., up to 90%, flows directly to the gas exhaust path 62 without reaction. The gas exhaust path 62 may be heated to about 80° C. by the path heater 100 so that the source gas is maintained in gas state.

The exhaust gas discharged from the chamber flowing in the gas exhaust path 62 pass through the pressure control valve 64, the first vacuum pump 66, the trap assembly 68, the second vacuum pump 70 and the waste gas scrubber 72 in that order. At this point, CO gas remains in the exhaust gas flow while the unreacted source gas is trapped by the trap assembly. CO is then combusted in the waste gas scrubber 72 into $CO_2$ which can be released to the atmosphere.

When the exhaust gas flows in the trap assembly 68, the exhaust gas is cooled upon contact with the trap panels 84 of the trap unit 86. The unreacted source gas species condense on the trap surfaces and thereby removed from the exhaust gas flow. Then the exhaust gas flows through the gas outlet 78 toward the downstream side of the gas exhaust path 62.

In a conventional trap assembly, trap panels 110 are installed such that the principal trap surfaces of the trap panels 110 are orthogonal to the flow direction of the exhaust gas, as shown in FIG. 7. In this configuration, the flow of the exhaust gas is disturbed upon encountering the trap surfaces, resulting in turbulent flows. A significant fraction of unreacted source gas species are caught in turbulent flows and tend to escape from being trapped by the trap panels 110, which counteracts the capture efficiency of the trap device.

According to embodiments of the present invention, the principal surfaces of the trap panels 84 are oriented in parallel to the flow direction of the exhaust gas and spaced apart from each other at a predetermined interval in a direction orthogonal to the now direction of the exhaust gas, as shown in FIG. 8. Thereby, the disturbance to the exhaust gas flow caused by the trap panel is reduced, resulting in less turbulence flows. The unreacted source gas in the exhaust gas can make effective contact with the trap panels 84 and consequentially the capture rate of the source gas is advantageously improved.

Since the trap panels 84 are installed at multiple stages along the flow direction of the exhaust gas and a substantial portion (see FIG. 6) of the cross section of the housing 74 is covered by the sum of projection planes of the trap panels 84 in the flow direction of the exhaust gas, the exhaust gas can make effective and sufficient contact with the principal trap surfaces 92 of the trap panels 84 without being significantly disturbed. As a result, the capture rate of the unreacted source gas can be significantly increased.

The unreacted source gas molecules can be trapped on the auxiliary trap surfaces 93 of the trap panels 84 which are perpendicular to the flow of the exhaust gas or on the surfaces of the supporting rods 88 and the supporting ring 90. In a maintenance operation to remove the trapped material from the trap assembly, the opening/closing lid 80 is detached from the main body of the housing 74. The trap units 86 supported as one unit by the supporting rods 88 are removed together from the main body of the housing 74.

In some embodiments, the various trap surfaces in a trap assembly may have surface irregularities (unevenness) which can be formed by roughening treatment, such as a sandblast treatment, or Scotch Bright™ surface conditioning. This increases the adhesion of the trap services to the gas species. As a result, the capture rate of the reactive source gas can be further improved.

Moreover, a material similar or same as the material be trapped, e.g., the source material as in this example, may be pre-coated onto the trap panels 84 before used on-site or before processing. When a nucleus is formed by condensation of the unreacted source gas on the surface of the trap panels, subsequent nucleus formation is facilitated because the incubation time is shortened. Hence, the capture rate of the source gas can be further improved. For example, during maintenance of the trap assembly, a layer of the trapped material may be intentionally left on the trap surfaces, rather than being completely removed.

Although trapping the unreacted source gas has been described in great detail in the above example, embodiments of the present invention can also be used to trap any condensable gas molecules, particles, or clusters discharged from the process chamber, such as the reaction by-products generated in the film formation process.

While the trap assembly and the film forming apparatus in accordance with the embodiments of the invention have been described in detail with reference to the accompanying drawings, the technical scope of the trap assembly and the film forming apparatus of the present invention is not limited to the above-described examples. It will be understood by those skilled in the art that various changes and modifications may be made without departing from the scope of the invention as defined in the following claims. Further, such changes and modifications are also included in the technical scope of the trap assembly and the film forming apparatus of the present invention. Moreover, a plurality of embodiments and modifications can be combined within the range that does not contradict the contents thereof.

In one embodiment, the trap panels 84 are uniformly cooled. The trap panels 84, however, may have a temperature gradient in which the temperature gradually decreases in the flow direction of the exhaust gas. Thus, the temperature of the trap panels 84 is higher on the upstream side than the downstream side to prevent the exhaust gas from being trapped disproportionally by the trap panels 84 on the upstream side. The trap disproportion can cause the flow path to be narrowed or even blocked near the trap panels 84 on the upstream side. For instance, the temperature of the trap panels 84 on the upstream side is about 25° C. to 30° C., and the temperature of the trap panels 84 on the downstream side is about 20° C. to 25° C.

In the embodiment shown in FIG. 3, the arrangement pitch L2 between the trap panels 84 is set to be uniform. However, the arrangement pitch L2 is not limited thereto, and there may be a pitch gradient in which the arrangement pitch L2 is gradually decreased from the upstream side toward the downstream side in the flow direction of the exhaust gas. This can also prevent disproportional trap on the upstream side of the exhaust gas. In one embodiment, the trap panels 84 may feature both the pitch gradient and the temperature gradient.

In the embodiment shown in FIG. 3, the trap panels 84 have a rectangular cross section. However, the cross-sectional shape of the trap panels 84 is not limited thereto and may be an oval shape or the like.

Further, in the above embodiment, the supporting ring 90 and the supporting rods 88 are installed to support the trap panels 84. However, both ends or one ends of the trap panels 84 may be directly attached to the inner surface of the housing 74 in some other embodiments. Accordingly, there is no gap between the outer peripheral surface of the supporting ring 90 and the inner peripheral surface of the housing 74 as shown in FIG. 2. Therefore, the entire cross section of the housing 74 can be covered by the sum of projection planes of the trap panels 84 in the flow direction of the exhaust gas. Here, the housing 74 has a circular cross section. However, the cross sectional shape of the housing 74 is not limited thereto and may be, e.g., quadrilateral shaped or the like.

The above embodiment has described the case in which $Ru_3(CO)_{12}$ is used as an organic metal compound source. However, it is not limited thereto, and the organic metal compound may be made of a material selected from a group consisting of $Ru_3(CO)_{12}$, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Os_3(CO)_{12}$, $Ta(CO)_5$, TEMAT (tetrakisethyltnethylaminotitanium), TAIMATA, $Cu(EDMDD)_2$, $TaCl_5$, TMA (trimethylaluminum), TBTDET (tertiarybutylimidotrisdiethylamidotantalum), PET (pentaethoxytantalum), TMS (tetramethylsilane), TEH (terakisethoxyhafinium), $Cp_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i-PrCp)_2Mn[=Mn(C_3H_7C_5H_4)_2]$, $MeCpMn(CO)_3[=(CH_3C_5H_4)Mn(CO)_3]$, $(t-BuCp)_2Mn[=Mn(C_4H_9C_5H_4)_2]$, $CH_3Mn(CO)_5$, $Mn(DPM)_3[=Mn(C_1H_{19}O_2)_3]$, $Mn(DMPD)(EtCp)tCMn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, $Mn(acac)_3[=Mn(C_5H_7O_2)_3$.

Embodiments of the present invention can also be applied when other types of source/precursor material are used. The film forming apparatus described above is merely an example, and the present invention can be applied to any material processing apparatus using a source gas and/or have volatile by-product. Further, embodiments the present invention can be applied to a so-called batch type film forming apparatus for processing a plurality of wafers at one time as well as a single wafer type film forming apparatus.

The wafer as referred to above may have a silicon substrate or a compound semiconductor substrate such as GaAs, SiC, GaN or the like. The present invention is not limited to the above substrates and may also be applied to a glass substrate used for a liquid display device, a ceramic substrate, or the like.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A trap assembly comprising:
a housing configured to form a gas exhaust conduit for an exhaust gas flow discharged from a processing chamber, wherein the housing has an end plate serving as a detachable lid;
a plurality of trap units disposed inside the housing, wherein the plurality of trap units are arranged successively along a flow direction of the exhaust gas flow, wherein each trap unit comprises a set of trap panels parallel to each other and spaced apart from each other, wherein each trap panel comprises a first surface and a second surface that has a smaller surface area than the first surface, wherein respective first surfaces of the set of trap panels are oriented substantially parallel to the flow direction, and wherein respective second surfaces of the set of trap panels are oriented orthogonal to the flow direction;
a supporting rod, wherein the plurality of trap units are coupled to the supporting rod, and wherein the supporting rod is coupled to the endplate; and
a cooling jacket provided to the end plate of the housing to cool trap panels of the plurality of trap units, wherein the cooling jacket is disposed on a downstream side of the exhaust gas flow, wherein the cooling jacket, the supporting rod and the plurality of trap units are configured to cause a temperature gradient in the plurality of trap units along the flow direction, and wherein, with the temperature gradient, a trap unit on an upstream side of the exhaust gas flow has a greater temperature than a trap unit on the downstream side of the exhaust gas flow.

2. The trap assembly of claim 1, wherein the plurality of trap units comprise a first trap unit and a second trap unit disposed adjacent to the first trap unit, wherein trap panels of the first trap unit are shifted relative to trap panels of the second trap unit in a direction orthogonal to the exhaust gas flow.

3. The trap assembly of claim 2,
wherein the set of trap panels comprise a same thickness,
wherein the plurality of trap units comprise a first group of trap units, and
wherein an area sum of projection planes of trap panels of the first group of trap units covers at least 95% of a cross section area of the housing, wherein the projection planes are orthogonal to the flow direction.

4. The trap assembly of claim 1, wherein the set of trap panels of each trap unit is supported as an integrated unit by a supporting ring.

5. The trap assembly of claim 4, wherein a coolant path is provided to the supporting ring and the supporting rod.

6. The trap assembly of claim 1, wherein the plurality of trap units, the supporting rod and the endplate are removable from the housing as an integrated unit.

7. The trap assembly of claim 1, wherein a gap between adjacent trap panels in a trap unit of a downstream side of the exhaust gas flow is smaller than a gap between adjacent trap panels in a trap unit of an upstream side of the exhaust gas flow.

8. The trap assembly of claim 1, wherein the set of trap panels comprise coarse surface irregularities.

9. The trap assembly of claim 1, wherein each trap panel of the plurality of trap units has a manufactured coating layer comprised of a material to be trapped by the trap assembly.

10. A film forming apparatus for forming a thin film on a substrate by using a source gas, the film forming apparatus comprising:
a processing chamber;
a mounting table configured to support the substrate;
a gas introduction unit configured to introduce a gas into the processing chamber;
a gas supply system having a source gas supply system coupled to the gas introduction unit to supply the source gas; and
a gas exhaust system coupled to the processing chamber and configured to receive an exhaust gas flow discharged from the processing chamber,
wherein the gas exhaust system comprises a trap assembly comprising:
a housing configured to form a gas exhaust conduit for the exhaust gas flow, wherein the housing has an end plate serving as a detachable lid;
a plurality of trap units disposed inside the housing, wherein the plurality of trap units are arranged successively along a flow direction of the exhaust gas flow, wherein each trap unit comprises a set of trap panels parallel to each other and spaced apart from each other, wherein each trap panel comprises a first surface and a second surface that has a smaller surface area than the first surface, wherein first surfaces of the set of trap panels are oriented substantially parallel to the flow direction, and wherein second surfaces of the set of trap panels are oriented orthogonal to the flow direction;
a supporting rod, wherein the plurality of trap units are coupled to the supporting rod, and wherein the supporting rod is coupled to the endplate; and
a cooling jacket provided to the end plate of the housing to cool trap panels of the plurality of trap units, wherein the cooling jacket is disposed on a downstream side of the exhaust gas flow, wherein the cooling jacket, the supporting rod and the plurality of trap units are configured to cause a temperature gradient in the plurality of trap units along the flow direction, and wherein, with the temperature gradient, a trap unit on an upstream side of the exhaust gas flow has a greater temperature than a trap unit on the downstream side of the exhaust gas flow.

11. The film forming apparatus of claim 10, wherein the plurality of trap units comprise a first trap unit and a second trap unit disposed adjacent to the first trap unit, wherein trap panels of the first trap unit are shifted relative to trap panels of the second trap unit in a direction orthogonal to the exhaust gas flow.

12. The film forming apparatus of claim 11,
wherein the set of trap panels comprise a same thickness,
wherein the plurality of trap units comprise a first group of trap units, and
wherein an area sum of projection planes of trap panels of the first group of trap units covers at least 95% of a cross section of the housing, wherein the projection planes are orthogonal to the flow direction.

13. The film forming apparatus of claim 10, wherein the set of trap panels of each trap unit is supported as an integrated unit by a supporting ring.

14. The film forming apparatus of claim 13, wherein coolant path is provided to the supporting ring and the supporting rod.

15. The film forming apparatus of claim 10, wherein the plurality of trap units, the supporting rod and the endplate are removable from the housing as an integrated unit.

16. The film forming apparatus of claim 10, wherein a gap between adjacent trap panels in a trap unit of a downstream side of the exhaust gas flow is smaller than a gap between adjacent trap panels in a trap unit of an upstream side of the exhaust gas flow.

17. The film forming apparatus of claim 10, wherein the set of trap panels comprise coarse surface irregularities.

18. The film forming apparatus of claim 10, wherein each trap panel of the plurality of trap units has a manufactured coating layer composed of a material to be trapped by the trap assembly.

* * * * *